(12) United States Patent
Mano

(10) Patent No.: US 6,202,184 B1
(45) Date of Patent: Mar. 13, 2001

(54) SEMICONDUCTOR INTEGRATED CIRCUIT DEVICE

(75) Inventor: Shigehiro Mano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/121,827

(22) Filed: Jul. 24, 1998

(30) Foreign Application Priority Data

Jul. 25, 1997 (JP) .................................... 9-216026

(51) Int. Cl.[7] .............................. G11C 29/00; G06F 11/00
(52) U.S. Cl. ............................................ 714/726; 714/738
(58) Field of Search ..................................... 714/726, 728, 714/731, 738, 739, 744, 814; 713/500, 600

(56) References Cited

U.S. PATENT DOCUMENTS

| 5,519,714 | * | 5/1996 | Nakamura et al. | 714/726 |
| 5,559,811 | * | 9/1996 | Abramovici et al. | 714/738 |
| 5,835,501 | * | 11/1998 | Dalmia et al. | 714/704 |
| 6,023,778 | * | 2/2000 | Li | 714/726 |

FOREIGN PATENT DOCUMENTS

| 58-96744 | 6/1983 | (JP) . |
| 2-257650 | 10/1990 | (JP) . |
| 3-282381 | 12/1991 | (JP) . |
| 4-83184 | 3/1992 | (JP) . |
| 4-152543 | 5/1992 | (JP) . |
| 5-259284 | 10/1993 | (JP) . |
| 5-288808 | 11/1993 | (JP) . |
| 6-138191 | 5/1994 | (JP) . |
| 6-148289 | 5/1994 | (JP) . |
| 7-128400 | 5/1995 | (JP) . |
| 7-198796 | 8/1995 | (JP) . |
| 7-294606 | 11/1995 | (JP) . |

* cited by examiner

*Primary Examiner*—Christine T. Tu
(74) *Attorney, Agent, or Firm*—Sughrue, Mion, Zinn, Macpeak & Seas, PLLC

(57) ABSTRACT

A semiconductor IC (Integrated Circuit) device with a dynamic BT (Bias Test) capability includes a semiconductor IC including a clock generator. A clock output from the clock generator is once fed to the outside of the IC and again input to a clock input terminal included in the IC. In response to the clock, a data generator generates a data signal for a dynamic BT. The data signal is sequentially propagated through a group of registers also included in the IC. At the time of a dynamic BT, the device does not need a clock from an external pattern generator or various control signals and thereby reduces the dynamic BT cost.

18 Claims, 9 Drawing Sheets

SEMICONDUCTOR INTEGRATED CIRCUIT DEVICE

BACKGROUND OF THE INVENTION

The present invention relates to a semiconductor device and, more particularly, to a semiconductor IC (Integrated Circuit) device having a dynamic bias test (BT) capability.

A semiconductor IC device with a dynamic BT capability is disclosed in, e.g., Japanese Patent Laid-Open Publication No. 7-198796. The IC device taught in this document is constructed to effect a dynamic BT without resorting to a clock or various control signals input from an external pattern generator and thereby reduce the dynamic BT cost. However, the conventional IC device has some problems left unsolved, as follows. First, the IC device includes a semiconductor IC having a plurality of internal pattern generators and a plurality of switches exclusively assigned to a dynamic BT, resulting in a great amount of exclusive hardware for a dynamic BT. Second, such exclusive internal pattern generators and switches each must be interconnected by particular signal wiring, increasing the total wiring length in the IC. Third, the switches intervening between an input terminal and the internal circuitry of the IC aggravates a circuit delay time and a wiring delay time at the output wirings of the switches.

Technologies relating to the present invention are also disclosed in, e.g., Japanese Patent Laid-Open Publication No. 58-96744, 2-257650, 4-152543, 5-259284, 5-288808, 6-138191, 6-148289, 7-128400, and 7-294606.

SUMMARY OF THE INVENTION

It is therefore an object of the present invention to provide a semiconductor IC device not needing, at the time of a dynamic BT, a clock from an external pattern generator or various control signals and thereby reducing the dynamic BT cost.

It is another object of the present invention to provide a semiconductor IC device capable of reducing the amount of exclusive hardware for a dynamic BT.

It is still another object of the present invention to provide a semiconductor IC device not degrading the wiring efficiency of a semiconductor IC despite exclusive circuitry for a dynamic BT.

It is a further object of the present invention to provide a semiconductor IC device with exclusive dynamic BT circuitry not aggravating a delay.

In accordance with the present invention, a semiconductor IC device includes a clock generator included in a semiconductor IC for generating a clock, a clock input terminal to which the clock is input by way of the outside of the semiconductor IC, a BT data generator for generating a data signal for a BT in response to the clock input to the clock input terminal, and a group of registers included in the semiconductor IC for sequentially transferring the data signal.

Also, in accordance with the present invention, a semiconductor IC device includes a data generator for generating a data signal for a BT on the basis of a clock input to a clock input terminal. A first selector is responsive to a selection control signal for selecting either one of the data signal of the data generator and an input signal input to a scan input terminal, and feeds the signal selected to an internal function section. A second selector is responsive to the selection control signal for selecting either one of a signal output from the internal function section and a signal output from an internal clock generator, and outputs the signal selected via an output terminal. Flip-flops included in the internal function section form a scan path in response to a scan mode control signal, and thereby cause the signal output from the output terminal connected to the second selector to be again connected to the clock input terminal.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figure 1:
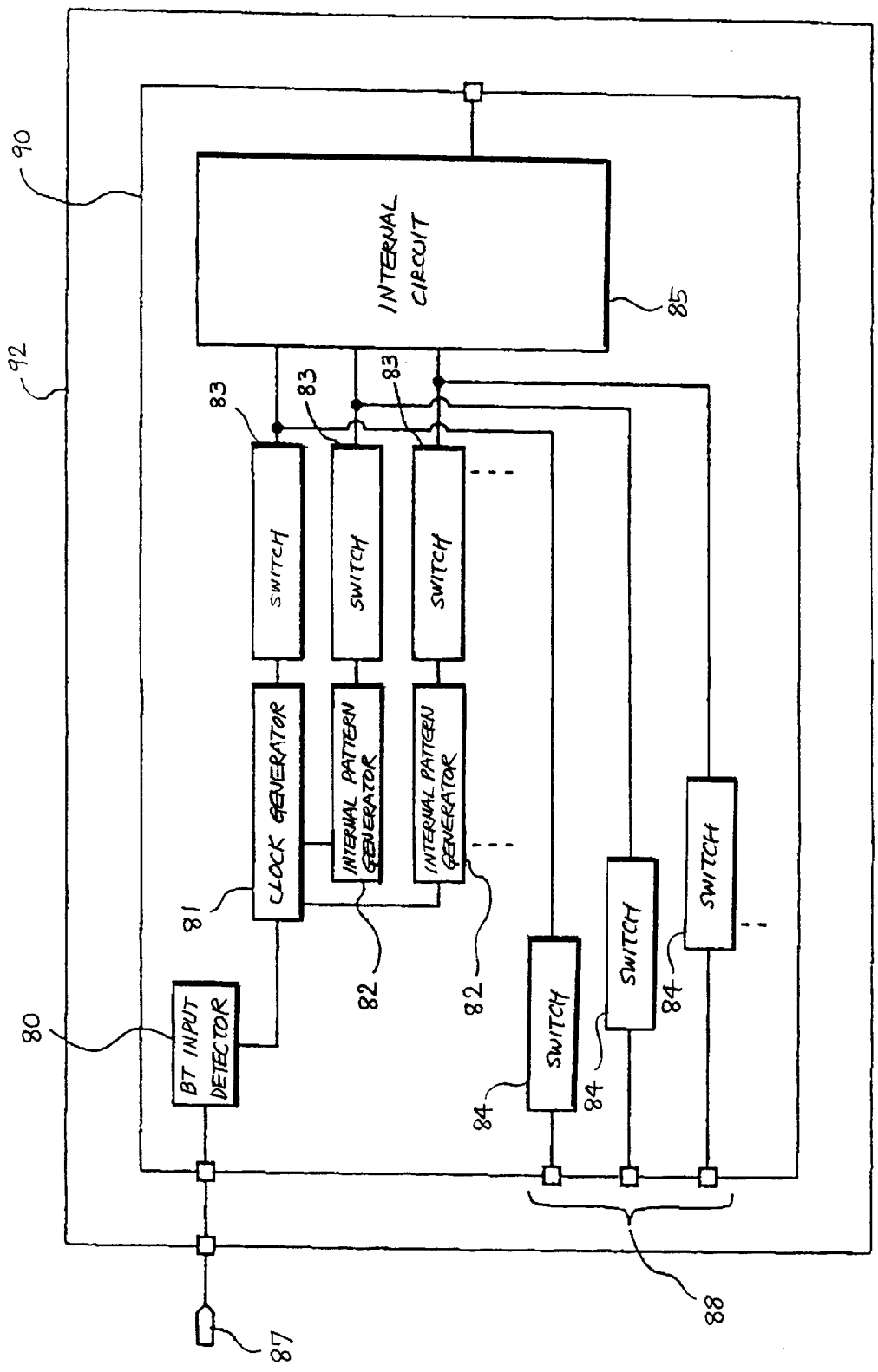
FIG. 1 is a block diagram schematically showing a conventional semiconductor IC device.

To better understand the present invention, brief reference will be made to a conventional semiconductor IC device having a dynamic BT capability. As shown, a single BT input 87 and a power source are input from a BT board 92 to a semiconductor IC 90. The BT input 87 is applied to a BT input detector 80 whose output is connected to the input of a clock generator 81. The outputs of the clock generator 81 are respectively connected to the inputs of a plurality of internal pattern generators 82. Another output of the clock generator 81 is connected to an internal circuit 85, which serves the original circuit function, via a switch 83. The internal pattern generators 82 each is also connected to the internal circuit 85 via a respective switch 83. In FIG. 1, there are also shown switches 84 and an input terminal 88.

For a dynamic BT, the IC 90 is mounted to the BT board 92 with its signal input/output pins inserted into socket pins, not shown, included in the board 92. Only the BT input 87 is input to the input terminal of the BT board 92. The power source and ground necessary for the BT are also input to the power source and ground of the IC circuit 90 via the socket pins. When a signal of logical low level or "L" is applied to the BT input 87, the BT input detector 80 determines that a test signal has been input, and causes the clock generator 81 to output a clock. The internal pattern generators 82 each generates a particular internal pattern signal in response to the clock.

When the BT input is of low level, the switches 83 are turned on while the switches 84 are turned off. When the BT input is of logical high level or "H", the switches 83 are turned off while the switches 84 are turned on. Therefore, when the BT input is in its low level, the internal pattern signals are fed from the internal pattern generators 82 to the internal circuit 85 via the switches 83 for effecting a dynamic BT. When the BT input is in its high level, usual operating signals are input to the internal circuit 85 via the switches 84, so that the circuit 85 performs the original operation assigned thereto.

The above conventional IC device has some problems left unsolved, as discussed earlier.

Figure 2:
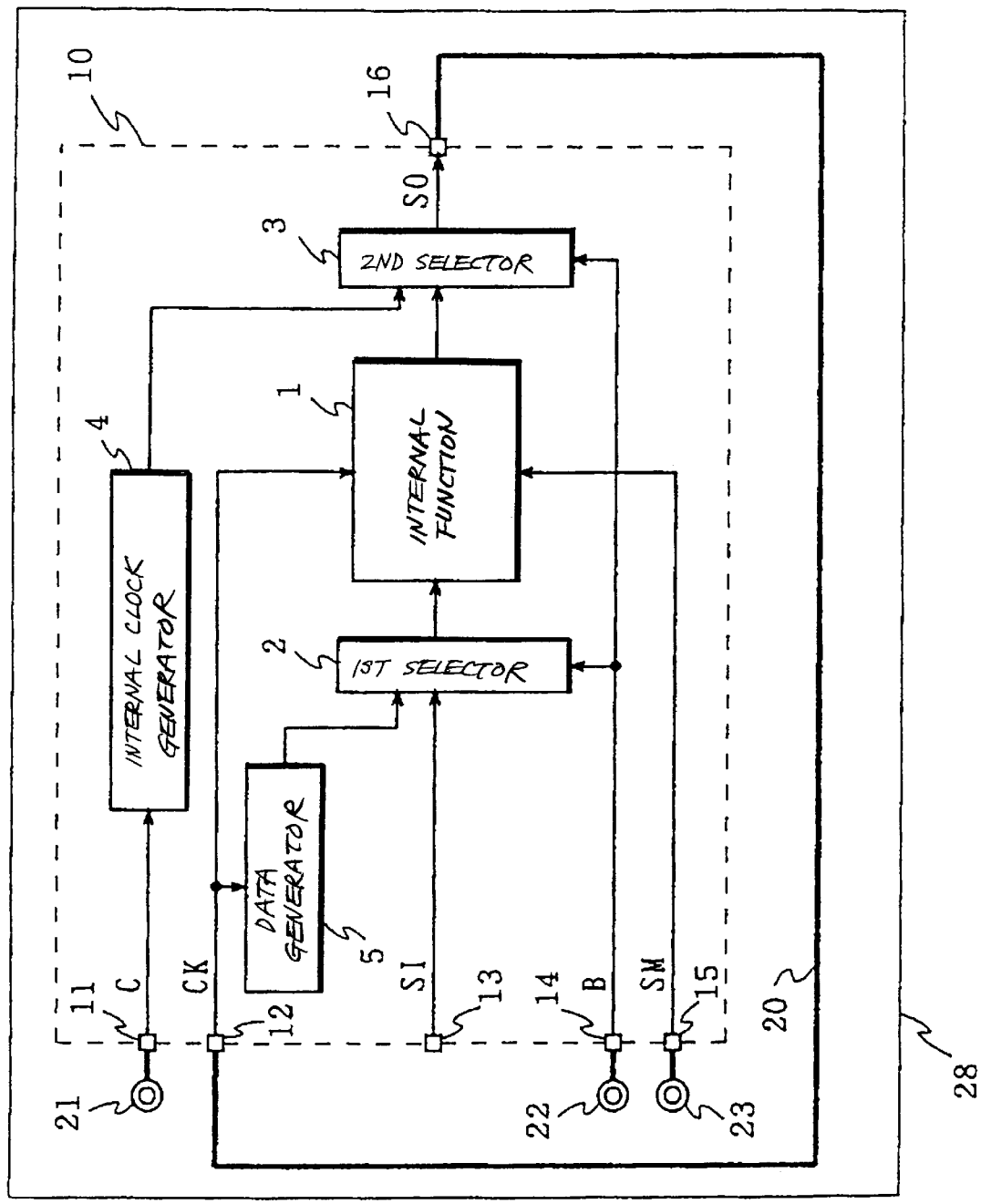
FIG. 2 is a block diagram schematically showing a semiconductor IC device embodying the present invention.

Referring to FIG. 2, a semiconductor IC device embodying the present invention is shown. As shown, a semiconductor IC, generally 10 and sometimes referred to as an LSI hereinafter, includes a clock input terminal 12. A clock signal input to the clock input terminal 12 is delivered to various registers included in an internal function 1 serving the original logical function. Also, the clock signal is delivered to a data generator 5 for generating data for a dynamic BT. The data generator 5 outputs a high level and a low level alternately in response to the consecutive clock pulses.

The internal function 1 includes scanning means. With the scanning means, the internal function 1 is capable of scanning the registers thereof in response to a signal input to a scan mode control terminal 15. When the scanning means is activated, a signal output from a first selector 2 is input to the scan input of the internal function 1. The first selector 2 selects, based on the level of a selector control terminal 14, either one of a signal output from the data generator 5 and a signal input to the scan input terminal 13.

A second selector 3 selects, based on the level of the selection control terminal 14, either one of a signal output from an internal clock generator 4 and a scan output signal derived from the scanning means of the internal function 1. The signal selected by the second selector 3 is fed to a scan output terminal 16 included in the LSI 10. When the first selector 2 selects the output signal of the data generator 5, the second selector circuit 3 selects the output signal of the internal clock generator 4. When the first selector 2 selects the signal input to the scan input terminal 15, the second selector 3 selects the scan output signal of the internal function 1.

When a signal is input to a clock generation control terminal 11 included in the LSI 10, the internal clock generator 4 outputs a clock. A wiring pattern 20 is formed on the BT board 28. When the LSI 10 is inserted into an LSI socket, not shown, provided on the BT board 28, the scan output terminal 16 and clock input terminal 12 are connected to each other by the wiring pattern 20. In addition, a power source and ground necessary for a dynamic BT are input from a BT board 28 to the power source and ground of the LSI 10 via the LSI socket.

The operation of the illustrative embodiment will be described with reference to FIG. 2. For a dynamic BT, the BT board 28 with the LSI 10 mounted thereto is put in a constant temperature vessel, and then a power source voltage is applied to the LSI 10. At this instant, the clock generation control terminal 11 is clamped by the BT board 28 at a level allowing a clock generation command signal to be input to the terminal 11.

The selection control terminal 14 is also clamped by the BT board 28 at a level causing the first and second selectors 2 and 3 respectively select the output of the data generator 5 and the output of the internal clock generator 4. Further, the scan mode control terminal 15 is clamped by the BT board 28 at a level activating the scanning means of the internal function 1.

In the above condition, when a clock generation command signal is input to the internal clock generator 4 via the clock generation control terminal 11, the generator 4 outputs a clock. The clock is applied to the scan output terminal 16 via the second selector 3 and then applied to the clock input terminal 12 via the wiring pattern 20 of the BT board 28. Consequently, the clock is delivered to the data generator 5 and the registers built in the internal function 1 via the terminal 12.

The data generator 5 outputs a high level and a low level alternately in response to the consecutive clock pulses, as stated earlier. The output of the data generator 5 is fed to the internal function 1 via the first selector 2. Because the scanning means included in the internal function 1 is active at this stage of operation, the data input from the first selector 2 turn out scan input data. That is, the high level data and low level data are alternately input to the registers of the internal function 1. The outputs of the registers of the internal function 1 are connected also to a logical function section particular to the LSI. Therefore, logical circuitry following the registers varies in accordance with the variation of the contents of the above registers. In this manner, only if the BT board 28 with the LSI 10 is put in a constant temperature vessel and then applied with a power source voltage, the original function section of the LSI 10 starts its logical operation automatically for a dynamic BT.

Figure 3:
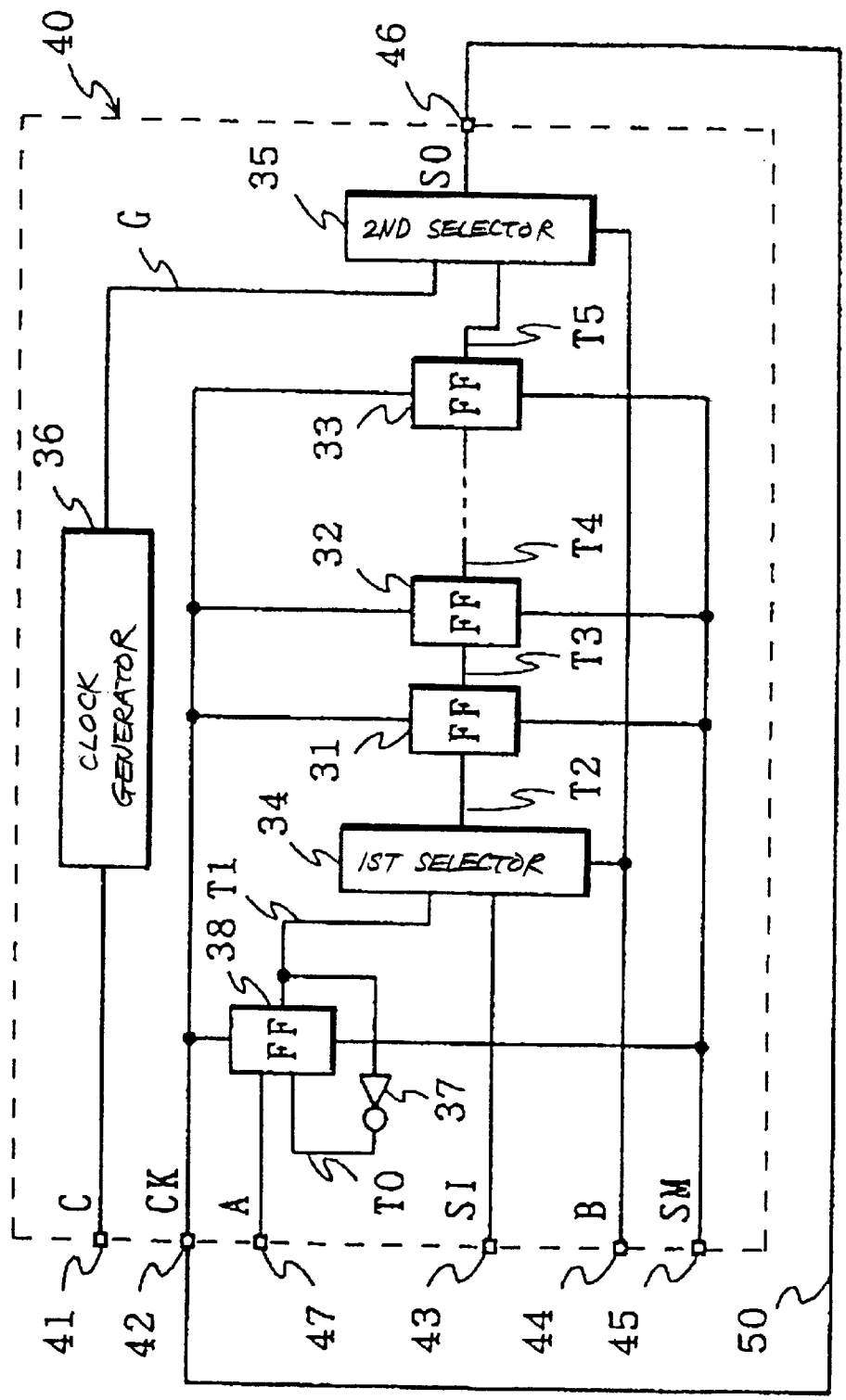
FIG. 3 is a schematic block diagram showing an alternative embodiment of the present invention.

Reference will be made to FIG. 3 for describing an alternative embodiment of the present invention. As shown, an LSI 40 includes a plurality of registers 31, 32, . . . , 33 implemented by flip-flops (FFs). Usually, the registers 31–33 perform the logical operation assigned to the LSI 40. When a signal is input to a scan mode control terminal 45, the registers 31–33 are brought into serial connection to constitute a shift register, i.e., to form a scan path for serial scanning.

FIG. 3 shows a condition set up in a scan mode. As shown, the registers 31–33 constitute a shift register. The output of a first selector 34 is connected to the scan input of the register 31 while the output of a second selector 35 is connected to the scan output of the register 33.

The first selector 34 selects a signal input to a scan input terminal 43 when a logical level input to a selector control terminal 44 is low, or selects a signal output from a register or FF 38 when the above logical level is high. The signal selected by the selector 34 is applied to the scan input of the register 31. The output signal of the register 38 is input to a signal inverter 37 also. The signal inverter 37 inverts the logical level of the input signal and feeds the resulting signal to the scan input terminal of the register 38. The register 38 and signal inverter 37 constitute a data generator for a BT in combination. The reference numeral 47 designates a data input terminal.

The second selector 35 selects a signal output from the register 33 when a logical level input to the selector control terminal 44 is low, or selects the output signal of a clock generator 36 when the above level is high. The signal selected by the selector 35 is applied to a scan output terminal 46 included in the LSI 40. The clock generator 36 outputs a clock when a logical level input to a clock generation control terminal 41 is high, but does not output it when the logical level is low.

For a dynamic BT, the LSI 40 is mounted to a BT board, not shown. The scan output terminal 46 and clock input terminal 42 of the LSI 40 are connected to each other by a wiring pattern 50 provided on the BT board. A logical high level is applied to the scan mode control terminal 45 in order to connect the registers 31–33 in a shift register configuration. A logical high level is applied to the selector control terminal 44 while a logical high level is applied to the clock generation control terminal 41.

As the clock generator 36 starts generating a clock, the clock is routed through the second selector 35, scan output terminal 46 and wiring pattern 50 to the clock input terminal 42 and applied from the terminal 42 to the registers 31–33 and 38. While the registers 31–33 are in the shift register configuration, logical levels stored in the shift registers 31 and 32 are sequentially shifted to the shift registers 32 and 33, respectively, in response to every clock pulse.

At the time when the power source voltage is applied to the LSI 40, the register 38 settles at the high level or the low level. This is a characteristic particular flip-flops in general. The output signal of the signal inverter 37 is input to the register 38 due to the logical level of the scan mode control terminal 45. Consequently, every time a clock pulse is applied to the register 38, the logical level of the register 38 occurred immediately before the clock pulse is inverted and set in the register 38. It follows that a low level and a high level are alternately set in the register 38 in response to the consecutive clock pulses. The logical level of the register 38 is transferred to the register 31 with a delay of one clock pulse and transferred to the register 32 with a delay of two clock pulses.

Figure 4:
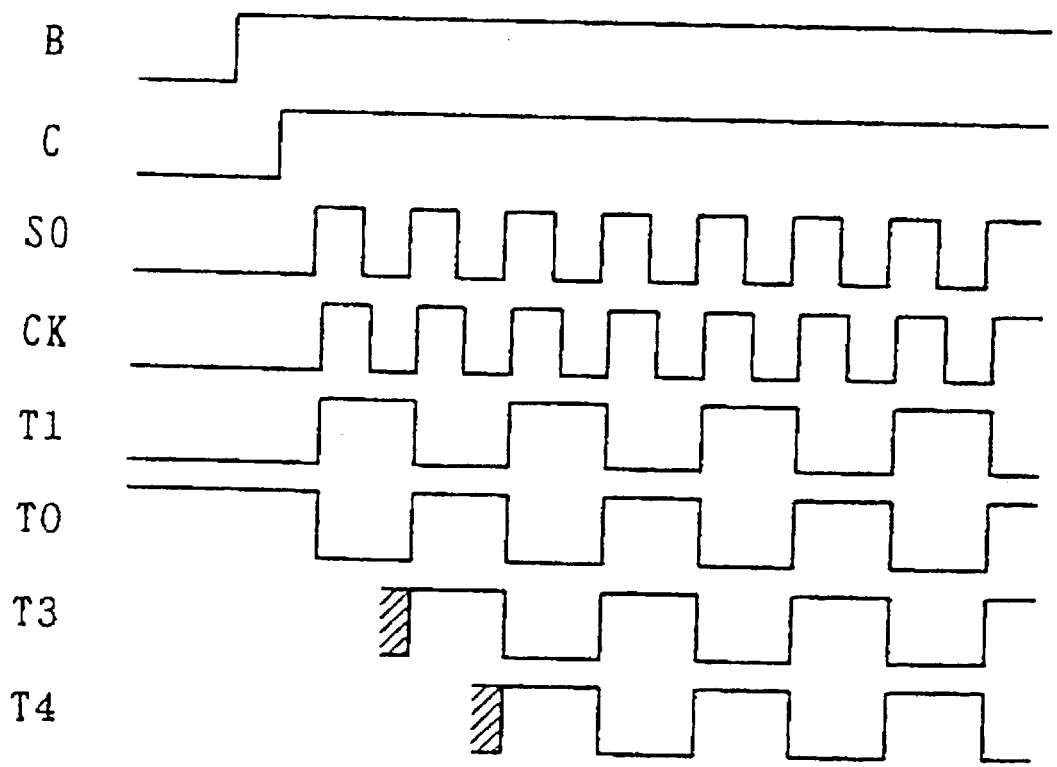
FIG. 4 is a timing chart demonstrating the operation of the illustrative embodiment.

FIG. 4 demonstrates the above operation in a timing chart. There are shown in FIG. 4 a signal B input to the selector control terminal 44, a signal C input to the clock generation control terminal 41, a signal SO output from the terminal 46, a clock CK input to the clock input terminal 42, a signal T1 output from the register 38, a signal T0 output from the inverter 37 and derived from the signal T1, a signal T2 output from the first selector 34, a signal T3 output from the register 31, and a signal T4 output from the register 32.

As stated above, the logical level of each of the registers 31–33 changes to "L" and "H" alternately in response to every clock pulse. As a result, logical circuitry built in the LSI 40 perform its logical operation in accordance with the variation of the registers 31–33. The logical circuitry can therefore operate easily without resorting to a clock or logical signals customarily introduced into the circuitry from the outside of a BT board.

Figure 5:
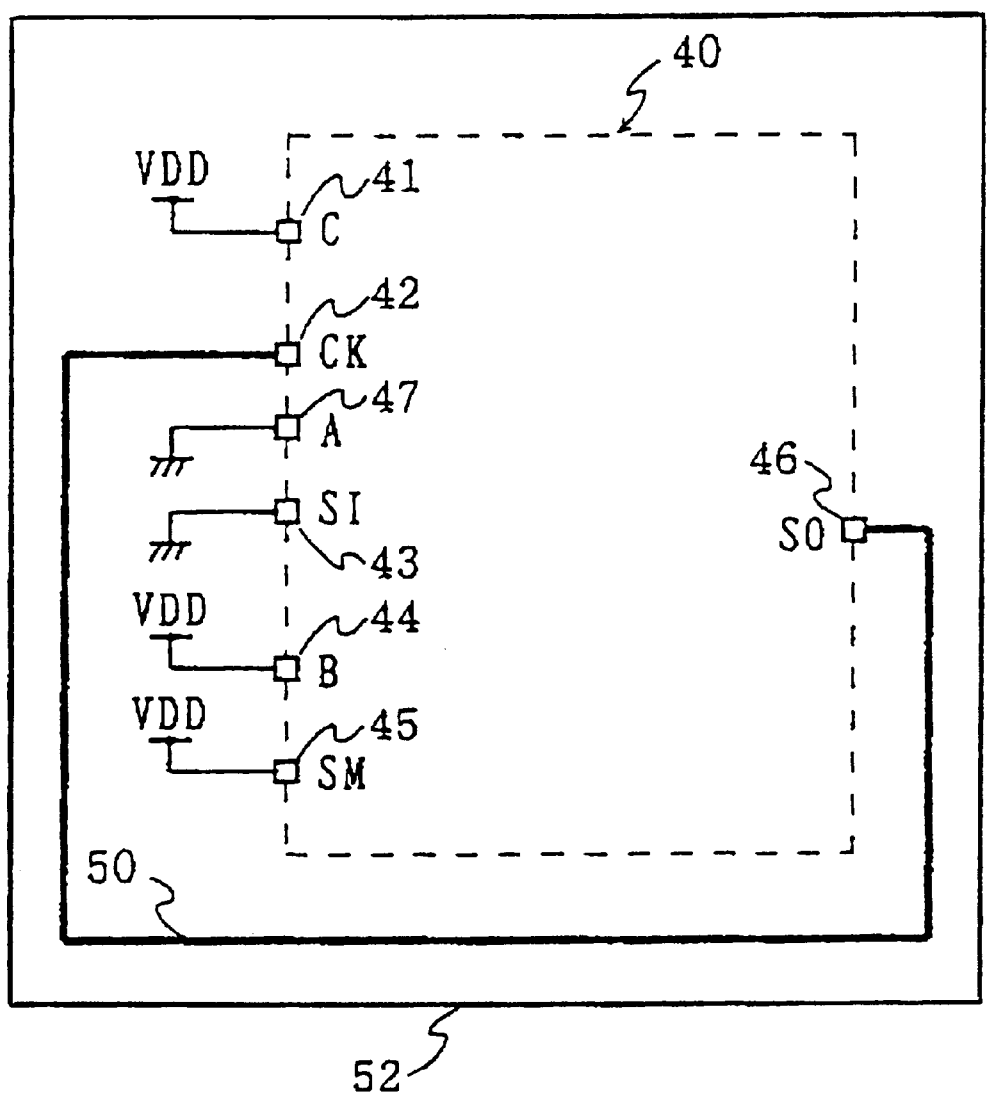
FIGS. 5–7 each shows a particular configuration in which the embodiment of FIG. 3 may be used.

A specific configuration for the practical use of the semiconductor IC device 40 will be described with reference to FIG. 5. As shown, the LSI 40 is mounted to a BT board 52. The configuration of the LSI 40 is identical with the configuration of FIG. 3 and is not shown in FIG. 5. A wiring pattern 50 is formed on the BT board 52 for feeding the signal SO output from the scan output terminal 46 to the clock input terminal 42. A power source clamp wiring for applying a logical high level to the terminals 41, 44 and 45 and a ground clamp wiring for applying a logical low level to the terminals 43 and 47 are also formed on the BT board 52.

In the above configuration, only if the BT board 52 with the LSI 40 is put in a constant temperature vessel and if a power source voltage is applied to the BT board 52, the LSI 40 starts operating automatically without resorting to a special tester or a pulse generator. In addition, sophisticated signal distribution from, e.g., a pulse generator to the LSI 40 is not necessary, so that a dynamic BT is facilitated.

For a usual IC test, only if a logical low level is applied to the selector control terminal 44 and if a clock signal is fed to the clock input terminal 42 from the outside of the LSI 40, any desired logical level an be set in each of the registers 31–33 via the scan input terminal 43 and first selector 34. Further, the logical levels of the registers 31–33 can be read via the second selector 35 and scan output terminal 46, implementing an LSI function test using a scan mode. In addition, signal pins can be efficiently used because the output terminal 46 plays the role of a scan output pin for an LSI function test and a clock generator output pin for a dynamic BT test at the same time.

Figure 6:
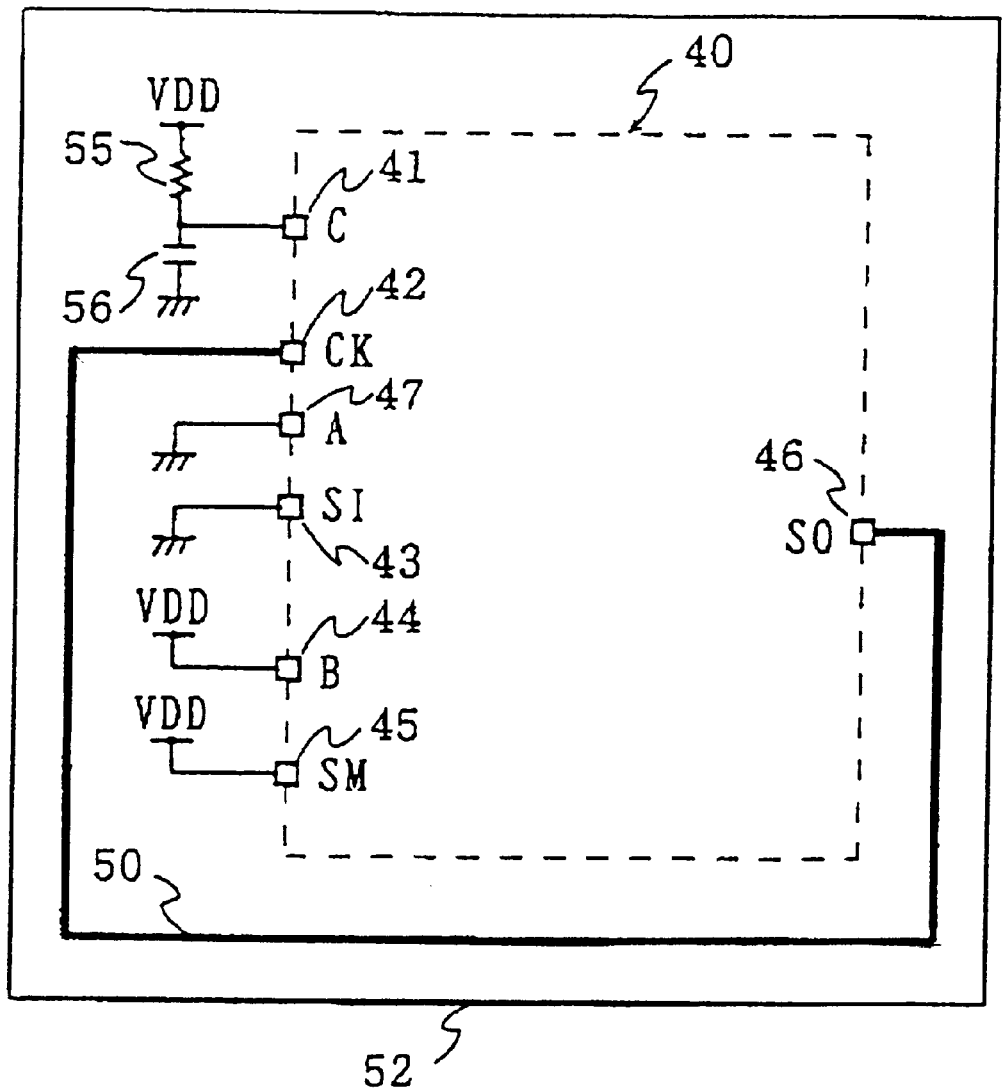

FIG. 6 shows another specific configuration in which the semiconductor IC device 40 is used. As shown, a resistor 55 and a capacitor 56 are mounted on the BT board 52 and serially connected between a power source and ground. The junction between the resistor 55 and the capacitor 56 is connected to the clock generation control terminal 41. After the BT board 52 with the LSI 40 has been put in a constant temperature vessel, a power source voltage is applied to the BT board 52. Just after the application of the power source voltage, no charge is stored in the capacitor 56. The terminal 41 therefore remains at its low potential and prevents the clock generation 36 from generating a clock. As the capacitor 56 is charged with the elapse of time, the potential on the terminal 41 increases. As soon as the terminal 41 reaches a high potential, the clock generation 36 starts generating a clock and causes the LSI 40 to start its operation for a dynamic BT. In this manner, the power source voltage is applied to the LSI 40 at the beginning so as to surely deactivate the clock generation 36 and stabilize the values of the registers 31–33 and 38. Thereafter, a clock generation command signal is applied to the clock generation 36. This further promotes the stable operation of the LSI 40.

Figure 7:
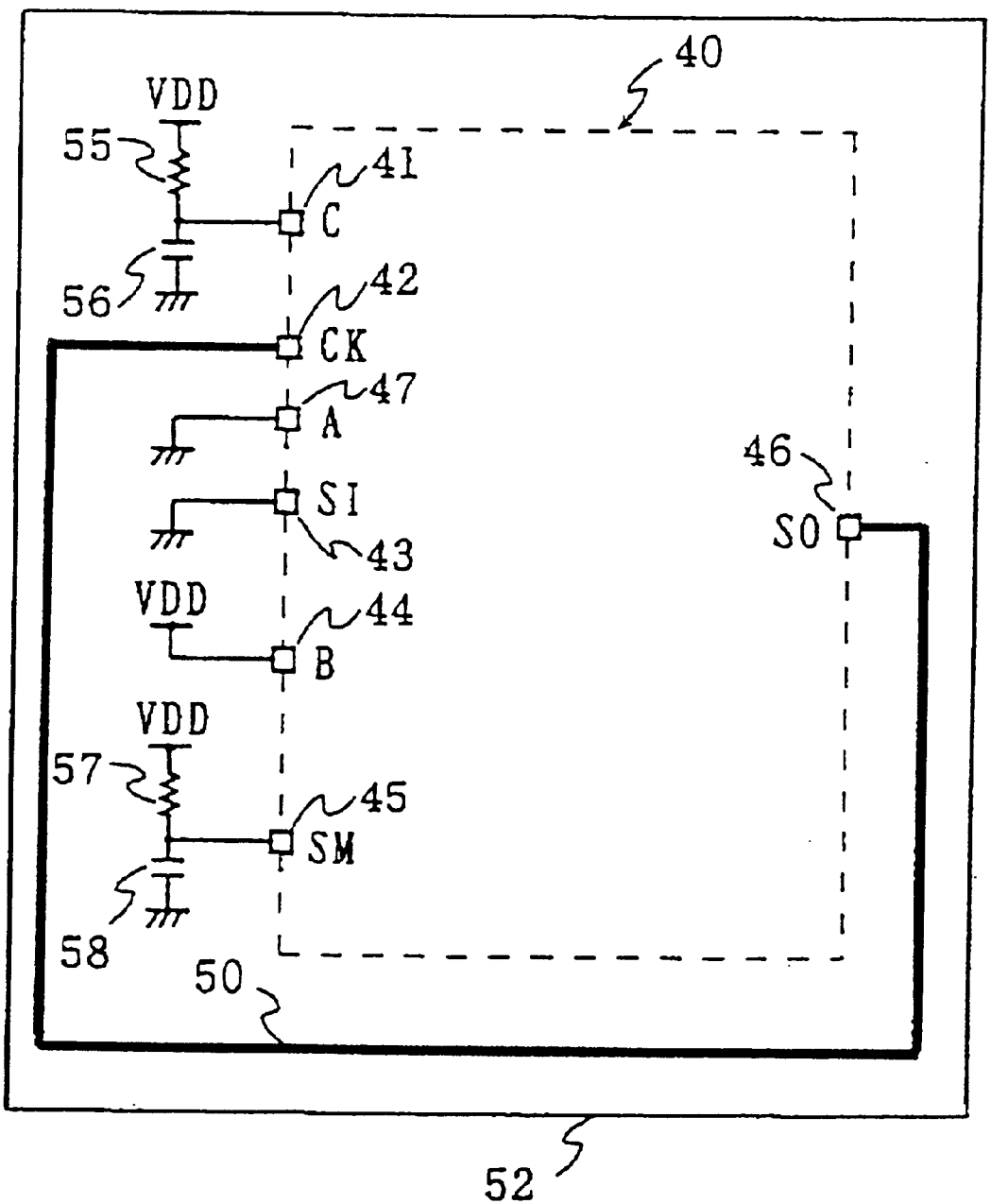
Figure 8:
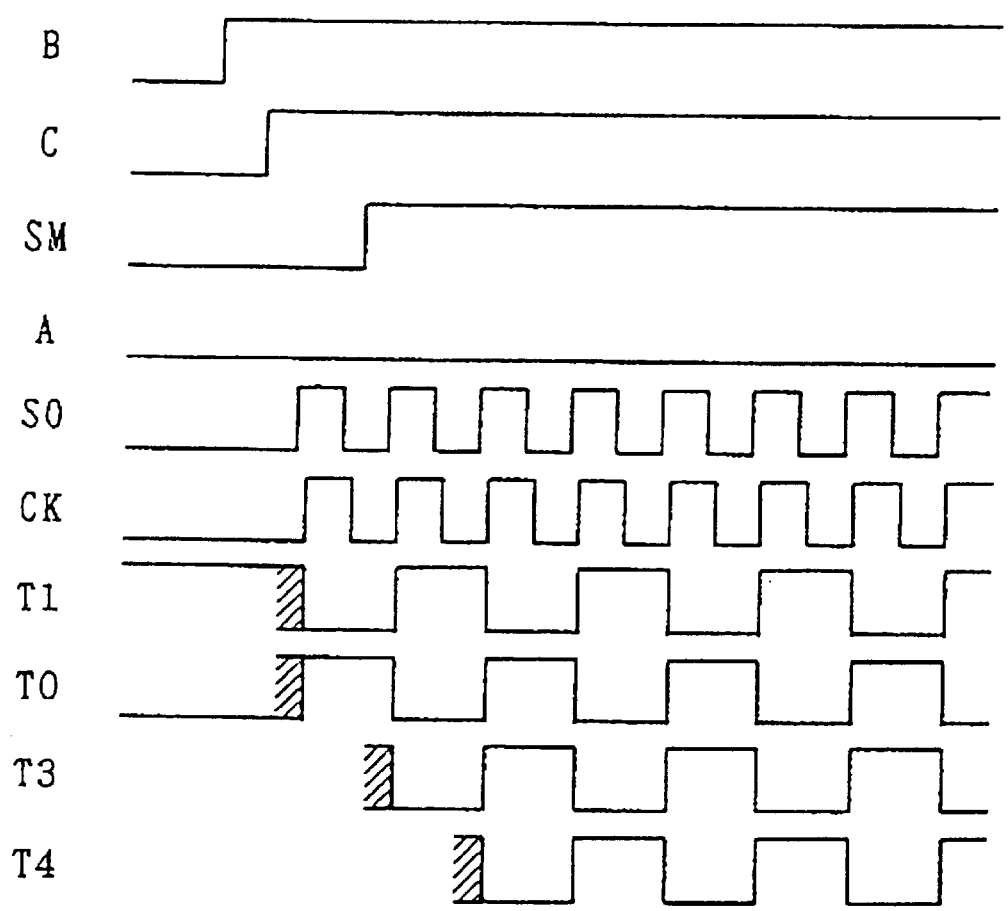
FIG. 8 is a timing chart representative of the operation of the configuration shown in FIG. 7.

FIG. 7 shows another specific configuration in which the semiconductor IC device 40 is used. As shown, this configuration is identical with the configuration of FIG. 6 except that a series connection of a resistor 57 and a capacitor 58 is additionally connected to the scan mode control terminal 45 on the BT board 52. In a series connection of a resistor and a capacitor, the potential at the junction rises in a period of time determined by the product of a resistance R and a capacity C, as well known in the art. In light of this, the resistances of the resistors 55 and 57 and the capacities of the capacitors 56 and 58 are adequately selected such that after the rise of the potential of the clock generation control terminal 41 to a high level, the potential of the scan mode control terminal 45 rises to a high level. This allows the application of a clock to occur first. Therefore, after the signal input to the data input terminal 47 has been set in the register 38, the registers 31–33 start shifting data in the scan mode. Consequently, the initial value can be surely set in the register 38 for insuring more stable operation. FIG. 8 is a timing chart demonstrating the above procedure specifically.

Figure 9:
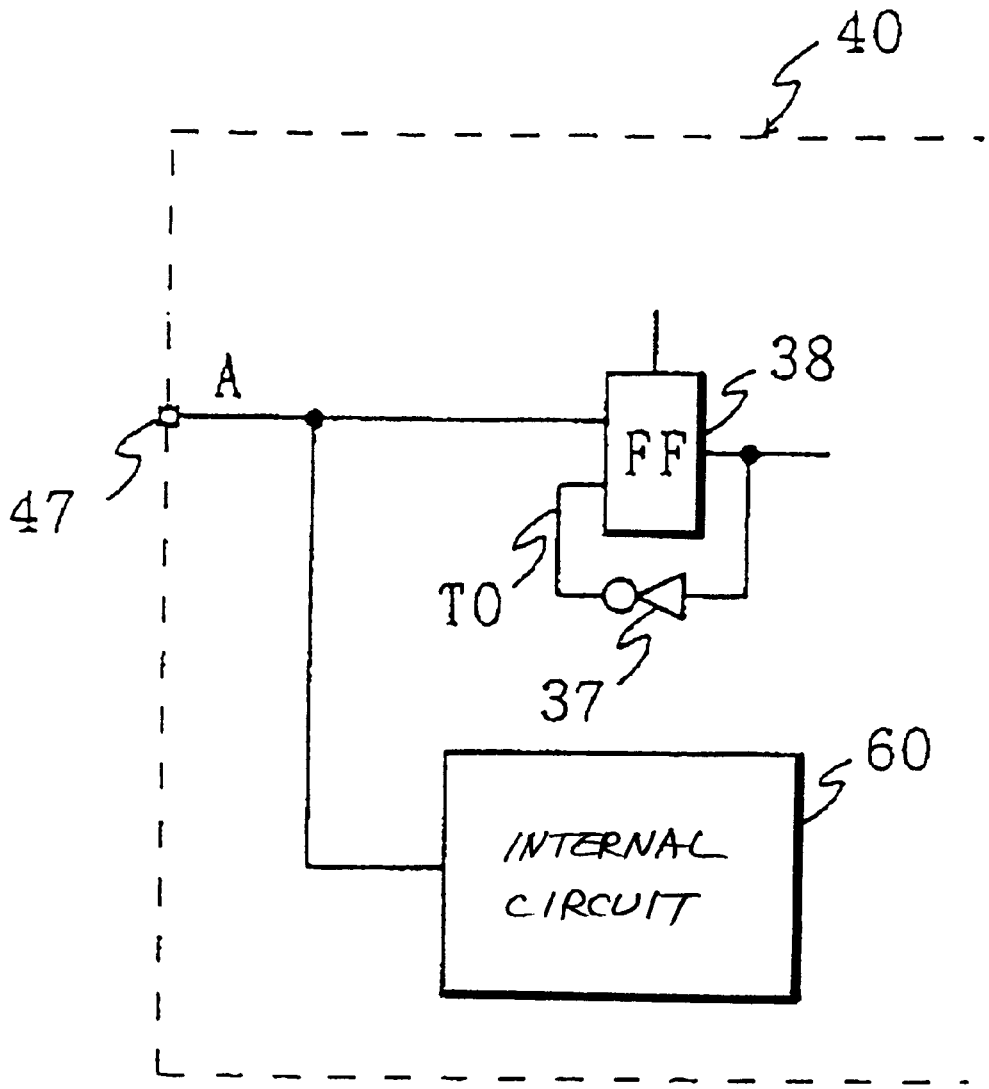
FIG. 9 is a block diagram showing another alternative embodiment of the present invention.

FIG. 9 shows another alternative embodiment of the present invention. As shown, the signal input to the register 38 via the input terminal 47 is also input to an internal circuit 60 to which the original logical operation is assigned. In this condition, when a dynamic BT is not conducted, the input terminal 47 is usable as the signal input terminal of the internal circuit 60 and therefore promotes the efficient use of signal pins available with the LSI 40.

In summary, it will be seen that the present invention provides a semiconductor IC device having various unprecedented advantages, as enumerated below.

(1) A semiconductor IC, or LSI, has a clock generator and a dynamic BT data generator thereinside and therefore does not need a clock or various control signals otherwise fed from, e.g., a pattern generator situated outside of the LSI. This successfully reduces the dynamic BT cost.

(2) A dynamic BT is implemented by a scanning function available with the internal function section of the LSI for an LSI test. Data generated by a single data generator for a dynamic BT is fed at the beginning of scanning. This scales down the circuit and wiring for a dynamic BT due to a minimum of additional hardware.

(3) Because a terminal used for a dynamic BT also plays the role of a scan terminal or an internal circuit terminal at the time of an LSI function test. This promotes the efficient use of terminals available with the LSI.

(4) The BT data generator is provided independently of the internal function section, so that BT data can be fed to the internal function section by use of scanning means. It is therefore needless to directly connect the wiring of the BT data generator to the internal function section or to arrange a feedback wiring for BT data generation in the internal function section. This internal function section free from such extra wirings and loads does not aggravate the delay of the expected logical function.Various modifications will become possible for those skilled in the art after receiving the teachings of the present disclosure without departing from the scope thereof.

What is claimed is: 1. A semiconductor IC device comprising:

a clock generator included in a semiconductor IC for generating a first clock signal;

a clock input terminal to which a second clock signal is input from outside said semiconductor IC;

a BT data generator that generates a first data signal for a bias test in response to said second clock signal;

a first selector, selecting one of said first data signal and a second data signal; and a group of registers included in said semiconductor IC for sequentially transferring the data signal selected by said first selector.

2. A device as claimed in claim 1, wherein said BT data generator outputs, as said first data signal, a logical high level and a logical low level alternately in response to consecutive biases of said second clock.

3. A device as claimed in claim 2, wherein said BT data generator comprises:

a register; and a signal inverter, wherein said signal inverter inverts a logical level output from said register and inputs the inverted logical level into an input of said register.

4. A device as claimed in claim 1, wherein the semiconductor IC further comprises a selection control terminal, and wherein, when said selection control terminal is connected to a clamp pattern provided on a BT board and when a power source voltage is applied to said BT board, said first selector selects said first data signal.

5. A device as claimed in claim 1, wherein the semiconductor IC further comprises a scan mode control terminal, and wherein, when said scan mode control terminal is connected to a clamp pattern provided on a BT board, and when a power source voltage is applied to said BT board and a potential level is applied to said scan control terminal, said group of registers is caused to operate in a scan mode.

6. A device as claimed in claim 5, wherein a time delay is set between an application of the power source voltage to said BT board and an application of said potential level to said scan mode control terminal.

7. A device as claimed in claim 1, wherein the semiconductor IC further comprises a clock generation control terminal, and wherein, when said clock generation control terminal is connected to a clamp pattern provided on a BT board, and when a power source voltage is applied to said BT board and a first potential is applied to said clock generation control terminal, said clock generator starts generating said first clock signal.

8. A device as claimed in claim 7, wherein a time delay is set between an application of the power source voltage to said BT board and an application of said first potential to said clock generation control terminal.

9. A device as claimed in claim 8, wherein:

the semiconductor IC further comprises a scan mode control terminal, and wherein, when said scan mode control terminal is connected to a clamp pattern provided on a BT board, and when a power source voltage is applied to said BT board and a second potential is applied to said scan control terminal, said group of registers is caused to operate in a scan mode; and a time delay is set between an application of the power source voltage to said BT board and an application of said second potential to said scan mode control terminal.

10. A device as claimed in claim 9, wherein the time delay relating to the scan mode is greater than the time delay relating to generation of said first clock signal.

11. A device as claimed in claim 9, further comprising a series connection of a resistor and a capacitor for setting any one of the time delays.

12. A device as claimed in claim 1, wherein the semiconductor IC further comprises a scan input terminal into which said second data signal is input to the semiconductor IC.

13. A device as claimed in claim 1, wherein the semiconductor IC further comprises:

a second selector, selecting one of an output of said group of registers and said first clock signal; and an output terminal out of which the signal selected by said second selector is output from said semiconductor IC.

14. A device as claimed in claim 13, wherein:

when said first selector selects said first data signal output, said second selector selects said first clock signal, and when said first selector selects said second data signal, said second generator selects said output of said group of registers.

15. A device as claimed in claim 13, wherein the semiconductor IC further comprises a selection control terminal, and wherein, when said selection control terminal is connected to a clamp pattern provided on a BT board and when a power source voltage is applied to said BT board, said second selector selects said first clock signal.

16. A device as claimed in claim 13, wherein the signal output from said output terminal of said semiconductor IC is input to said clock input terminal, wherein when said second selector selects said first clock signal, said first clock signal is input as said second clock signal.

17. A device as claimed in claim 16, wherein the signal output from said output terminal of said semiconductor IC is input to said clock input terminal via a wiring pattern formed on a BT board.

18. A semiconductor IC device comprising:

data generating means for generating a data signal for a BT on the basis of a clock input to a clock input terminal;

first selecting means responsive to a selection control signal for selecting one of said data signal of said data generating means and an input signal input to a scan input terminal, and feeding said data signal or said input signal to an internal function section; and second selecting means responsive to said selection control signal for selecting one of an output signal output from said internal function section and an output signal output from internal clock generating means, and outputting said output signal selected via an output terminal;

wherein flip-flops included in said internal function section form a scan path in response to a scan mode control signal, causing the output signal output from said output terminal connected to said second selecting means to be connected to said clock input terminal.

* * * * *